(12) United States Patent
Tsai et al.

(10) Patent No.: US 12,217,647 B2
(45) Date of Patent: *Feb. 4, 2025

(54) ELECTRONIC DEVICE

(71) Applicant: Innolux Corporation, Miao-Li County (TW)

(72) Inventors: Chia-Hao Tsai, Miao-Li County (TW); You-Cheng Lu, Miao-Li County (TW); Yi-Shiuan Cherng, Miao-Li County (TW); Wei-Yen Chiu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/481,972

(22) Filed: Oct. 5, 2023

(65) Prior Publication Data

US 2024/0038120 A1 Feb. 1, 2024

Related U.S. Application Data

(63) Continuation of application No. 17/894,170, filed on Aug. 24, 2022, now Pat. No. 11,823,605.

(30) Foreign Application Priority Data

Sep. 30, 2021 (CN) .......................... 202111166184.5

(51) Int. Cl.
| | |
|---|---|
| *G09G 3/3258* | (2016.01) |
| *G06V 40/13* | (2022.01) |
| *G09G 3/20* | (2006.01) |
| *H10K 59/126* | (2023.01) |

(52) U.S. Cl.
CPC ....... *G09G 3/2003* (2013.01); *G06V 40/1318* (2022.01); *H10K 59/126* (2023.02); *G09G 2300/0426* (2013.01)

(58) Field of Classification Search
CPC ......... G09G 3/2003; G09G 2300/0426; G09G 3/3233; G06V 40/1318; H10K 59/126
See application file for complete search history.

(56) References Cited

U.S. PATENT DOCUMENTS

2017/0033171 A1* 2/2017 Kim ..................... G09G 3/3233

* cited by examiner

*Primary Examiner* — Abdul-Samad A Adediran
(74) *Attorney, Agent, or Firm* — JCIPRNET

(57) ABSTRACT

An electronic device including a plurality of pixels and a driving element is provided. Each of the plurality of pixels includes a first sub-pixel, a second sub-pixel, and a third sub-pixel. The driving element drives each first sub-pixel of the plurality of pixels.

17 Claims, 13 Drawing Sheets

ELECTRONIC DEVICE

CROSS-REFERENCE TO RELATED APPLICATION

This application is a continuation application of a prior application Ser. No. 17/894,170, filed on Aug. 24, 2022, which claims the priority benefit of China application serial no. 202111166184.5, filed on Sep. 30, 2021. The entirety of the above-mentioned patent application is hereby incorporated by reference herein and made a part of this specification.

BACKGROUND

Technical Field

The disclosure relates to an electronic device, and particularly relates to an electronic device with a light-sensing element.

Description of Related Art

Display panels are important elements in various electronic devices. In order to allow various functions of an electronic device to be integrated, the display panel may be designed to be integrated or matched with other elements. For example, the display panel may be assembled with a light-sensing element, and the light-sensing element may be designed to be located under the screen, so that the display area ratio of the product increases. In such a design, the light-sensing element is arranged on the back side of the display panel, and the region in the display region of the display panel corresponding to the light-sensing element is designed as a transparent region, so that the light-sensing element may receive light through the transparent region. How to balance the light-transmitting effect of the transparent region and the display effect of the overall display panel is an important issue.

SUMMARY

The disclosure is directed to an electronic device capable of providing a uniform display effect as sell as a sufficient light-transmitting effect.

An embodiment of the disclosure provides an electronic device including a plurality of pixels and a driving element. Each of the plurality of pixels includes a first sub-pixel, a second sub-pixel, and a third sub-pixel. The driving element drives each first sub-pixel of the plurality of pixels.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
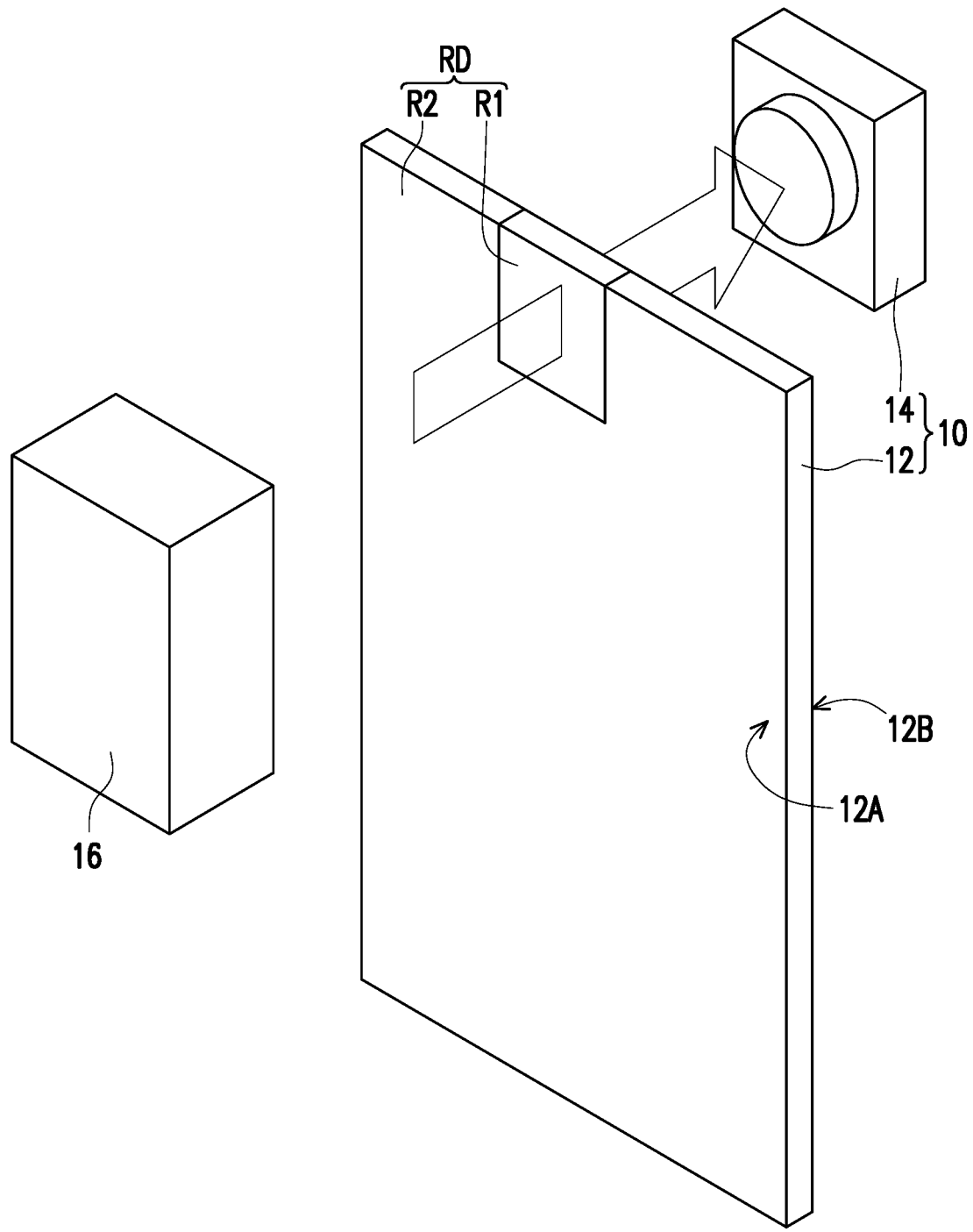
FIG. 1 is a schematic diagram of an electronic device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In the disclosure, when one structure (or layer, element, substrate) is described to be located on another structure (or layer, element, substrate), it means that the two structures are adjacent and directly connected (or contacted), or means that the two structures are adjacent but not directly connected (or contacted). Indirect connection means that there is at least one intermediate structure (or intermediate layer, intermediate component, intermediate substrate, intermediate space) between the two structures, and a lower surface of one structure is adjacent or directly connected to an upper surface of the intermediate structure, and an upper surface of the other structure is adjacent or directly connected (or contacted) to a lower surface of the intermediate structure, and the intermediate structure may be composed of a single layer or multi-layer solid structure or non-solid structure, which is not limited by the disclosure. In the disclosure, when a certain structure is disposed "on" another structure, it may mean that the certain structure is "directly" on the another structure, or that the certain structure is "indirectly" on the another structure, i.e., at least one structure is sandwiched between the certain structure and the another structure.

The electrical connection or coupling described in the disclosure may refer to direct connection or indirect connection. In the case of direct connection, terminals of components on two circuits are directly connected or connected to each other by a conductor line segment, and in the case of indirect connection, there are switches, diodes, capacitors, inductors, resistors, other suitable components, or a combination of the above-mentioned components between the terminals of the components on the two circuits, but the disclosure is not limited thereto.

In the disclosure, the measurement methods of thickness, length and width may be implemented by using an optical microscope, and the thickness may be measured according to a cross-sectional image in an electron microscope, but the disclosure is not limited thereto. In addition, any two values or directions used for comparison may have certain errors. If a first value is equal to a second value, it implies that there may be an error of about 10% or 5% or 3% between the first value and the second value.

It should be noted that, in the following embodiments, features in several different embodiments may be replaced, recombined, and mixed to complete other embodiments without departing from the spirit of the disclosure. As long as the features of the various embodiments do not violate the spirit of the disclosure or conflict with each other, they may be mixed and matched arbitrarily.

FIG. 1 is a schematic diagram of an electronic device according to an embodiment of the disclosure. An electronic device 10 of FIG. 1 includes a display panel 12 and a light-sensing element 14. The display panel 12 has a display side 12A and a back side 12B opposite to each other. The display side 12A of the display panel 12 may present an image to be displayed, and the light-sensing element 14 is located at the back side 12B of the display panel 12. To be specific, the display panel 12 may have a display region RD, and the display region RD may be divided into a transparent region R1 and another region R2 other than the transparent region R1 according to a distribution of light transmittance. The transparent region R1 may be regarded as a partial region of the display region RD with higher light transmittance. The entire display region RD may be used to present an image, so that the transparent region R1 is a region that may be used to present the image and has a certain light transmittance. In the electronic device 10, an arrangement position of the light sensing component 14 substantially corresponds to the transparent region R1. In this way, light may pass through the transparent region R1 and may be received by the light-sensing element 14. According to some embodiments, the light-sensing element 14 may include an image acquisition component, such as a camera. In this case, light from an object 16 on the display side 12A may pass through the transparent region R1 and may be received by the light-sensing element 14, thereby allowing the light-sensing element 14 to acquire an image of the object 16. In FIG. 1, the transparent region R1 is substantially located at an edge of the display region RD and an edge of the transparent region R1 is substantially coincided with the edge of the display region RD, but the disclosure is not limited thereto. In other embodiments, the transparent region R1 may be located in any part of the display region RD, and the transparent region R1 may be completely surrounded by the another region R2 of the display region RD. According to some embodiments, the light-sensing element 14 may include a biometric component, such as a fingerprint recognition component, and the object 16 may be a biological feature (such as a finger).

Figure 2:
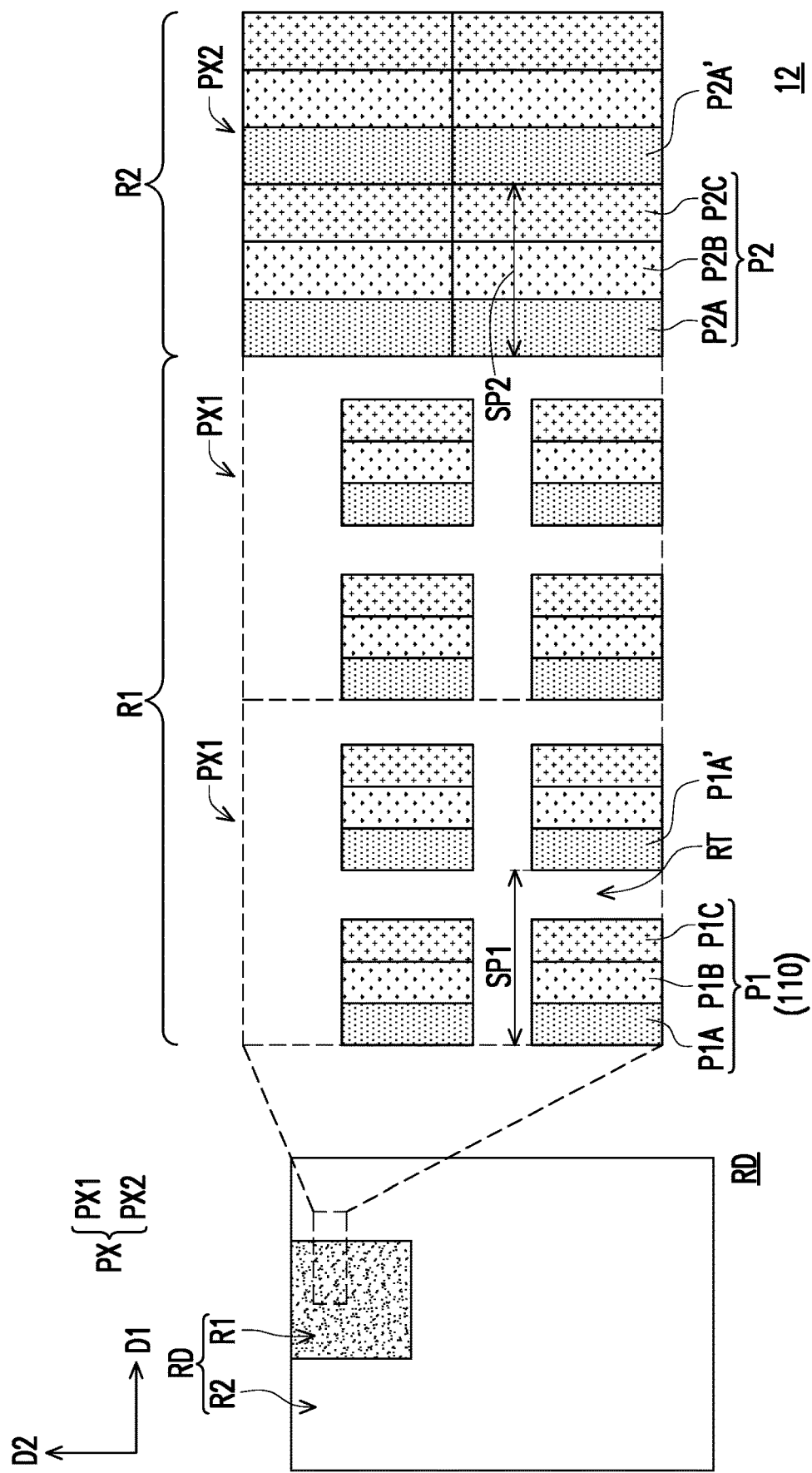
FIG. 2 is a schematic diagram of a display region of a display panel according to an embodiment of the disclosure.

FIG. 2 is a schematic diagram of a display region of the display panel 12 according to an embodiment of the disclosure. In FIG. 2, the display region RD of the display panel may include the transparent region R1 and the another region R2. Shown as a partial enlarged view of FIG. 2, FIG. 2 schematically shows that the display panel may include a plurality of pixel blocks PX in the display region RD, and the pixel blocks PX may be divided into pixel blocks PX1 located in the transparent region R1 and pixel blocks PX2 located in the another region R2 according to a distribution region. The display panel 12 is provided with a plurality of pixels P1 in the pixel block PX1 of the transparent region R1, and provided with a plurality of pixels P2 in the pixel block PX2 of the another region R2. According to some embodiments, as shown in FIG. 2, four pixels P1 are configured in each pixel block PX1 of the transparent region R1, and four pixels P2 are configured in each pixel block PX2 of the another region R2. However, the design of four pixels forming the pixel block is only used for illustration, and the disclosure is not limited thereto. In other embodiments, the number of pixels in each pixel block PX is not limited, which may be adjusted according to different design requirements.

Figure 7:
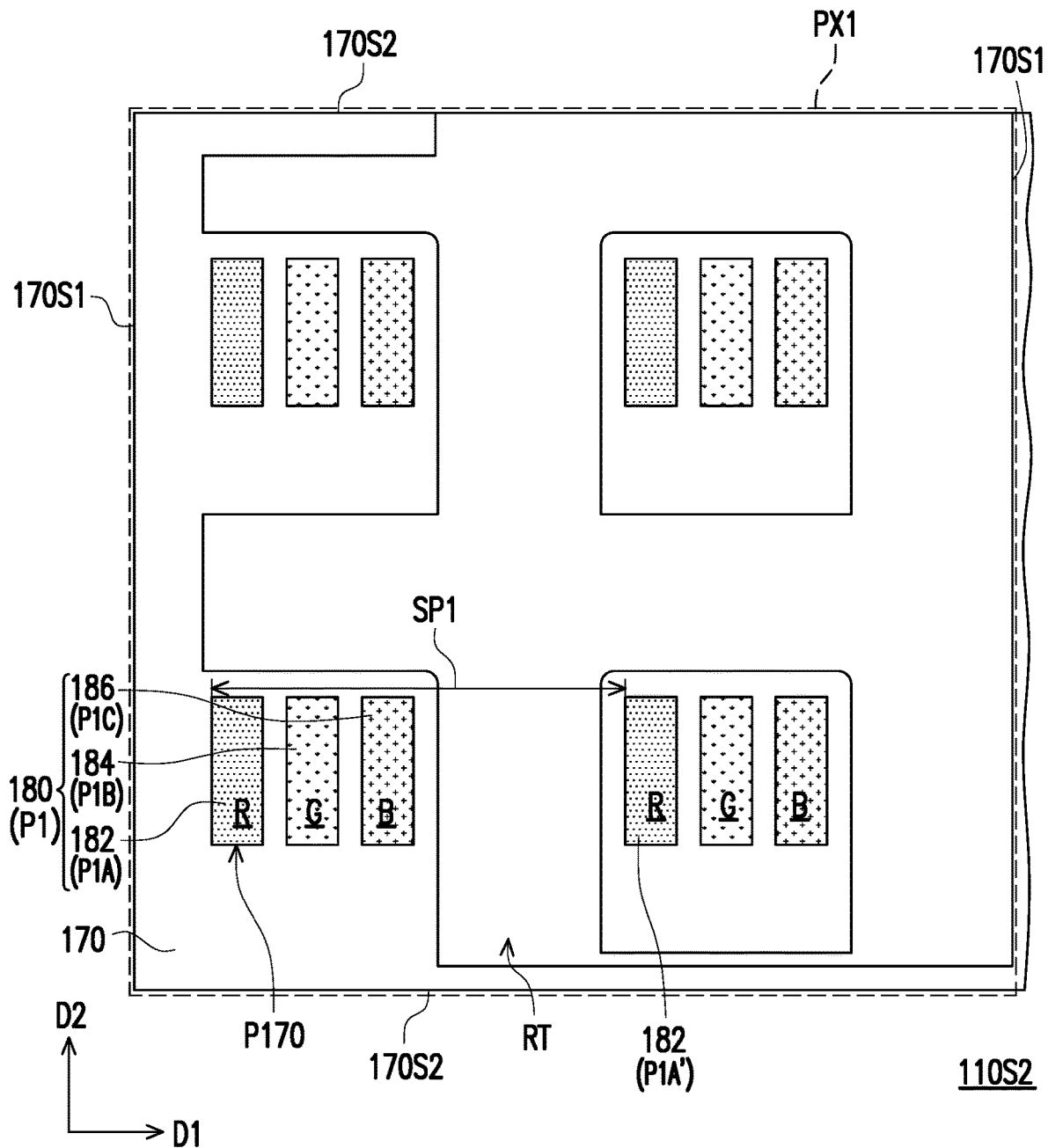
FIG. 7 is a schematic diagram of some elements of a counter substrate according to an embodiment of the disclosure.
Figure 12:
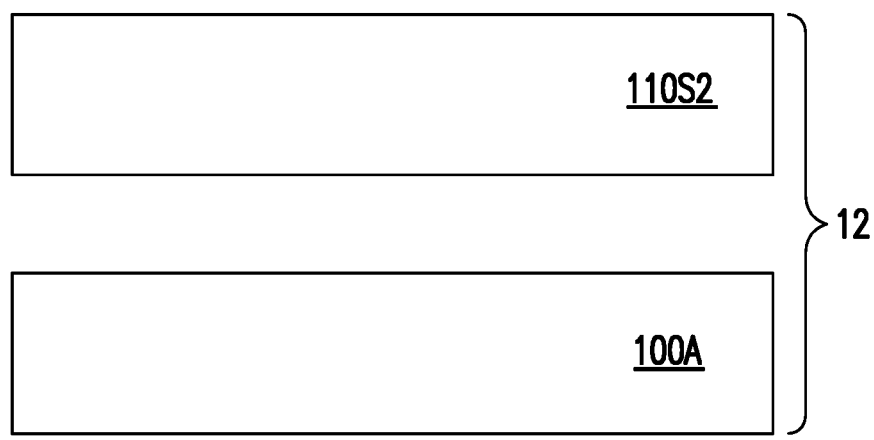
FIG. 12 is a schematic diagram of an electronic device according to an embodiment of the disclosure.

As shown in FIG. 12, the electronic device 10 includes a display panel 12. The display panel 12 may include an array substrate 100A and a counter substrate 100S2. The array substrate 100A and the counter substrate 100S2 may be disposed opposite to each other. FIG. 2 roughly shows the arrangement of the pixels P1 in the transparent region R1, but does not show some components such as a light-shielding layer on the counter substrate 100S2. FIG. 7 further shows the specific arrangement positions of the pixels P1 in the transparent region R1 on the counter substrate 100S2. FIG. 7 is a top view of the counter substrate 100S2 corresponding to the transparent region R1 of the display panel 12 according to some embodiments. To be specific, as shown in FIG. 7, the counter substrate 100S2 includes a light-shielding layer 170 and a color filter layer 180. As shown in FIG. 7, a transparent portion RT in the transparent region R1 is a portion other than the light-shielding layer 170 and the color filter layer 180. In some embodiments, an area ratio of the transparent portion RT in each pixel block PX1 may be adjusted according to actual requirements of different devices. For example, in some embodiments, the area ratio of the transparent portion RT in each pixel block PX1 may be between 30% and 80%, for example, between 50% and 70%, but the disclosure is not limited thereto. In other embodiments, the area ratio of the transparent portion RT may be adjusted according to different design requirements.

As shown in FIG. 2 and FIG. 7, according to some embodiments, in the transparent region R1, each pixel P1 may include a first sub-pixel P1A, a second sub-pixel P1B, and a third sub-pixel P1C, while in the another region R2, each pixel P2 may include a first sub-pixel P2A, a second sub-pixel P2B, and a third sub-pixel P2C. The first sub-pixel P1A, the second sub-pixel P1B, and the third sub-pixel P1C may be used to present different colors of display light, and the first sub-pixel P2A, the second sub-pixel P2B, and the third sub-pixel P2C may be used to present different colors of display light. In some embodiments, the display lights of different colors presented by different sub-pixels may be, for example, red, green and blue light, but the disclosure is not limited thereto. In other embodiments, the colors of the display light may be adjusted according to different design requirements.

As shown in FIG. 7, the light-shielding layer 170 has a plurality of openings P170, and the sub-pixels may be defined by the openings P170 of the light-shielding layer 170. For example, at the lower left of FIG. 7, the three openings of the light-shielding layer 170 define the first sub-pixel P1A, the second sub-pixel P1B, and the third sub-pixel P1C. In detail, the color filter layer 180 may include a first color filter pattern 182, a second color filter pattern 184 and a third color filter pattern 186, which respectively have different colors. In the transparent region R1 of the counter substrate 100S2, the first color filter pattern 182, the second color filter pattern 184 and the third color filter pattern 186 may be respectively disposed in the corresponding openings P170 of the light-shielding layer 170. In this way, the first color filter pattern 182, the second color filter pattern 184 and the third color filter pattern 186 may jointly achieve a full-color display effect. Namely, the first sub-pixel P1A, the second sub-pixel P1B and the third sub-pixel P1C may jointly achieve the full-color display effect. Regarding the pixel P2 in the another region R2 shown in FIG. 2, the first sub-pixel P2A, the second sub-pixel P2B and the third sub-pixel P2C may be similarly defined by the openings of the light-shielding layer in the another region R2, and detail thereof is not repeated.

Figure 3:
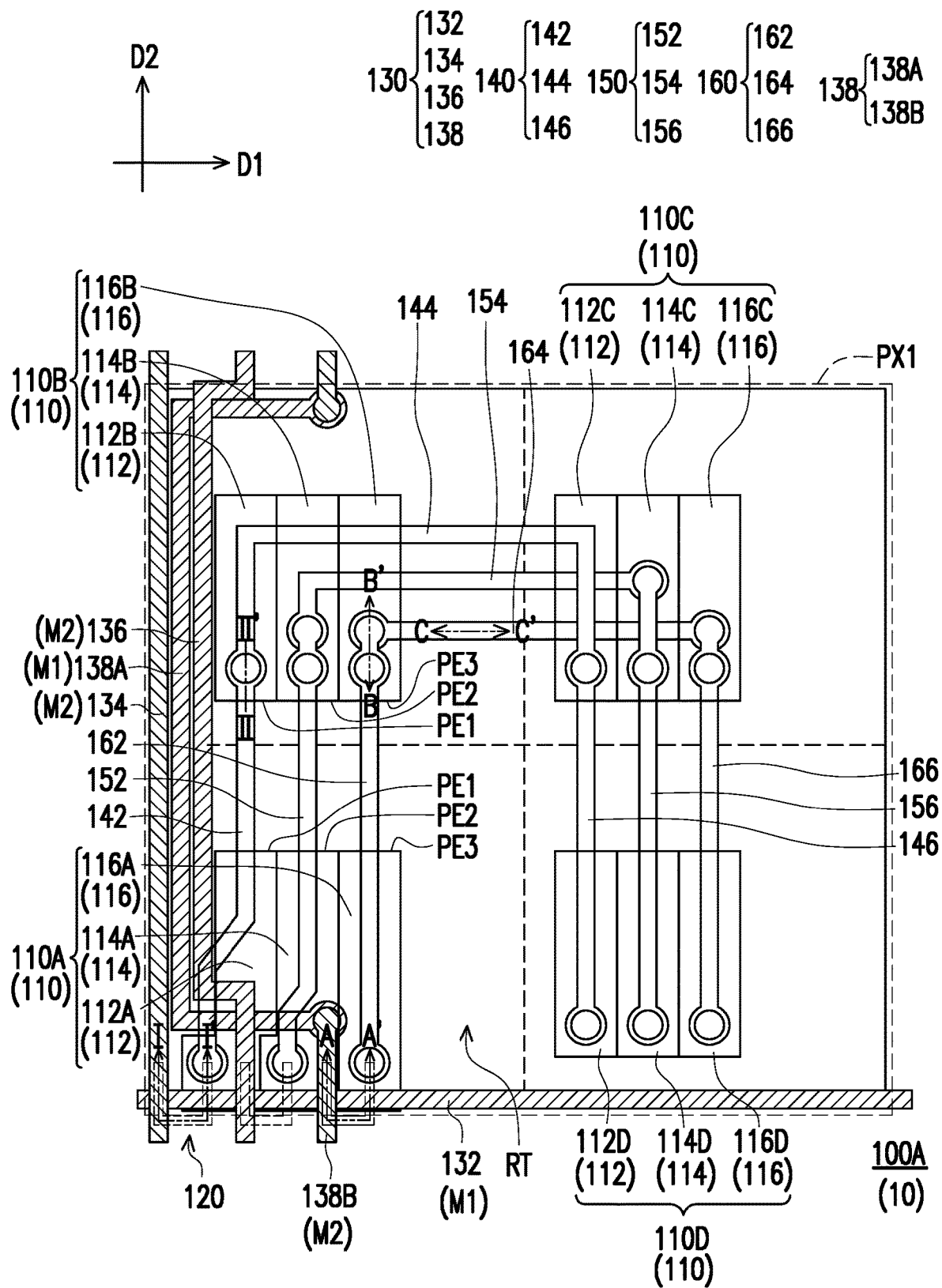
FIG. 3 is a partial schematic diagram of an array substrate according to an embodiment of the disclosure.

Referring to FIG. 2 and FIG. 7 together, a pixel space SP1 may be a distance between two adjacent sub-pixels of the same color. Specifically, as shown in FIG. 7, for example, the first sub-pixel P1A, the second sub-pixel P1B, and the third sub-pixel P1C may be respectively red (marked as R), green (marked as G), and blue (marked as G). A distance along one direction (for example, a first direction D1) between two adjacent sub-pixels P1A and P1A' that are both red is defined as the pixel space SP1. The first direction D1 may be an extending direction of a signal line 132 (scan line) (as shown in FIG. 3). The above-mentioned first sub-pixel P1A, second sub-pixel P1B, and third sub-pixel P1C being respectively red, green, and blue are regarded as illustrative only and not as restrictive. Similarly, as shown in FIG. 2, a pixel space SP2 in the another region R2 may be a distance between two adjacent sub-pixels of the same color. Specifically, a distance along the first direction D1 between two adjacent sub-pixels P2A and P2A' that are both red is defined as the pixel space SP2, and detail thereof is not repeated.

As shown in FIG. 2, according to some embodiments, in one pixel P1, the first sub-pixel P1A, the second sub-pixel P1B, and the third sub-pixel P1C may be aligned along the first direction D1. According to other embodiments (although not shown in the figure), in one pixel P1, the first sub-pixel P1A, the second sub-pixel P1B, and the third sub-pixel P1C may not be aligned along the first direction D1. As shown in FIG. 2, according to some embodiments, the first sub-pixels P1A, the second sub-pixels P1B, and the third sub-pixels P1C of two adjacent pixels P1 in the second direction D2 are aligned along the second direction D2. According to other embodiments (although not shown in the figure), the sub-pixels of two adjacent pixels P1 in the second direction D2 may be misaligned along the second direction D2. The arrangement of pixels and sub-pixels may be designed according to actual requirements, which is not intended to limit the disclosure.

As shown in FIG. 2, according to some embodiments, the pixel space SP1 in the transparent region R1 may be substantially equal to the pixel space SP2 in the another region R2. In this way, the transparent region R1 and the another region R2 may maintain a substantially same resolution, and the display panel 12 may display approximately similar image effects in the transparent region R1 and the another region R2. As such, poor display effects caused by inconsistent pixel spaces in different regions may not be provided, and local display granular sensation that may be generated in the transparent region R1 is prevented from occurring. Moreover, under the condition that the transparent region R1 and the another region R2 maintain the same pixel space, a pixel (or sub-pixel) size in the transparent region R1 is smaller, so that a transparent portion RT may be vacated. Therefore, according to some embodiments, an area of the pixel P1 in the transparent region R1 may be different from an area of the pixel P2 in the another region R2. For example, the area of the pixel P1 may be smaller than the area of the pixel P2.

As shown in FIG. 2 and FIG. 7, since the transparent region R1 also has the pixels P1, both of the transparent region R1 and the another region R2 may be used for displaying images. In the prior art, the light-sensing element 14 is usually disposed in a region without the displayed image, so that the display panel 12 has a smaller display area. Compared with the prior art, according to some embodiments, as shown in FIG. 1, the light-sensing element 14 is disposed at the position of the transparent region R1 of the display panel 12, and the transparent region R1 also has the pixels P1 to display images. Therefore, a full-screen display effect may be achieved without sacrificing a display area. Furthermore, due to the existence of the transparent portion RT, the transparent region R1 may have a higher light transmittance than the another region R2, so that by applying the transparent region R1 in the electronic device 10 of FIG. 1, the light-sensing element 14 may receive light of the display side 12A.

As shown in FIG. 1, the electronic device 10 includes the display panel 12. As shown in FIG. 12, the display panel 12 may include an array substrate 100A (as shown in FIG. 3) and a counter substrate 100S2 (as shown in FIG. 7). The array substrate 100A and the counter substrate 100S2 may be disposed opposite to each other. A structure of the array substrate 100A in the electronic device 10 is described in detail below. FIG. 3 is a partial schematic diagram of the array substrate 100A according to an embodiment of the disclosure. To be specific, FIG. 3 shows a pixel block of the display panel 12 in the transparent region, and the structure shown in FIG. 3 may be used as one of the implementations of the pixel blocks PX1 in the transparent region R1 of FIG. 2, but the disclosure is not limited thereto. In FIG. 3, the array substrate 100A in the electronic device 10 may include a plurality of pixels 110 and a driving element 120, where the pixels 110 may be used as an implementation of the pixels P1 in FIG. 2, but the disclosure is not limited thereto. Each of the plurality of pixels 110 includes a first sub-pixel 112, a second sub-pixel 114 and a third sub-pixel 116, and the driving element 120 may be used to drive the first sub-pixel 112 of each of the plurality of pixels 110. Namely, the driving element 120 may drive the plurality of first sub-pixels 112. Therefore, according to some embodiments, in the array substrate 100A, the number of the driving elements may be reduced, and the number of signal lines connected to the driving elements may also be reduced. In this way, an area of the light-shielding layer in the counter substrate 100S2 may be reduced, so that the area of the transparent portion RT may be increased, and the light transmittance of the transparent region R1 in the electronic device may be improved. In some embodiments, the pixel block PX1 may be provided with a plurality of driving elements according to the number of the sub-pixels of each pixel 110. For example, the pixel 110 in FIG. 3 is composed of three sub-pixels of the first sub-pixel 112, the second sub-pixel 114 and the third sub-pixel 116, and the number of the driving elements 120 may be three, which respectively drive the first sub-pixel 112, the second sub-pixel 112 and the third sub-pixel 116. In addition, in this embodiment, the description of the driving element 120 driving the first sub-pixel 112 may be interpreted as that the driving element 120 is electrically connected to the first sub-pixel 112, and the driving element 120 may enable the first sub-pixel 112 to display or the driving element 120 may switch a display function of the first sub-pixel 112.

The first sub-pixel 112, the second sub-pixel 114, and the third sub-pixel 116 may respectively include a sub-pixel electrode (for example, a first sub-pixel electrode PE1, a second sub-pixel electrode PE2, and a third sub-pixel electrode PE3), a part of a common electrode, and a corresponding color filter pattern. To be specific, the sub-pixel may include the sub-pixel electrode and a part of the common electrode included in the array substrate 100A, and the corresponding color filter pattern included in the counter substrate 100S2. Therefore, the arrangement of the first sub-pixel 112, the second sub-pixel 114 and the third sub-pixel 116 in FIG. 3 may also be interpreted as the arrangement of the sub-pixel electrodes of each sub-pixel. In addition, the so-called sub-pixels may be used to provide a driving electric field or a driving current to drive a display medium (not shown) or a luminescent material (not shown) to present a desired display effect. For example, when the display panel 12 is a liquid crystal display panel, the driving electric field provided by the sub-pixels may drive a liquid crystal material so that the liquid crystal material provides a function of a light valve to display an image. When the display panel 12 is a self-luminous display panel, the sub-pixels may provide a driving current to drive a luminescent material to emit light with a required luminous intensity to implement image display. However, these descriptions are for example only, and are not intended to limit the scope covered by the disclosure. In addition, the first sub-pixel 112, the second sub-pixel 114 and the third sub-pixel 116 may be used to present different display colors, so that the display panel 12 may provide a full-color display effect.

Moreover, the array substrate 100A further includes signal lines 130 for transmitting electrical signals. The signal lines 130 may include a signal line 132 for transmitting a scan signal, a signal line 134 for transmitting a first sub-pixel signal, a signal line 136 for transmitting a second sub-pixel signal, and a signal line 138 for transmitting a third sub-pixel signal. The signal lines may be electrically connected to the driving element 120. In detail, the sub-pixel electrodes in the sub-pixels may be electrically connected to the signal lines through the driving elements. In this way, the sub-pixels may receive signals through the signal lines. For example, the sub-pixel electrode PE1 in a first sub-pixel 112A may be electrically connected to the signal lines 132 and 134 through the driving element 120. In some embodiments, the signal line 132 may be, for example, a scan line, which may extend along the first direction D1. The signal line 134, the signal line 136 and the signal line 138 may be, for example, data lines, and may extend along the second direction D2, where the first direction D1 and the second direction D2 may be intersected.

In some embodiments, the driving element 120 may be turned on or off by signal control of the signal line 132, and when the driving element 120 is turned on, a signal transmitted on the signal line 132 may be transmitted to the first sub-pixel 112. Therefore, the driving element 120 is electrically connected to the signal line 132 and the signal line 134. Other driving elements not marked in FIG. 3 may be electrically connected to the signal line 136 and the signal line 138 respectively, and are also turned on or off by the signal transmitted by the signal line 132, so as to control the second sub-pixel 114 and the third sub-pixel 116 to display. In this embodiment, the signal line 134, the signal line 136 and the signal line 138 may be centrally arranged on one side of the four pixels 110, and the signal line 132 is arranged on the other side of the four pixels to surround the four pixels.

The region surrounded by the signal lines 130 may be understood as the pixel block PX1 in FIG. 2, but the disclosure is not limited thereto.

In FIG. 3, one pixel block PX1 includes a first pixel 110A, a second pixel 110B, a third pixel 110C, and a fourth pixel 110D. The first pixel 110A and the second pixel 110B may be arranged adjacent to each other along the second direction D2, the second pixel 110B and the third pixel 110C may be arranged adjacent to each other along the first direction D1, and the first pixel 110A and the fourth pixel 110D may be arranged adjacent to each other along the first direction D1. The first pixel 110A may include a first sub-pixel 112A, a second sub-pixel 114A and a third sub-pixel 116A, the second pixel 110B may include a first sub-pixel 112B, a second sub-pixel 114B and a third sub-pixel 116B, the third pixel 110C may include a first sub-pixel 112C, a second sub-pixel 114C, and a third sub-pixel 116C, and the fourth pixel 110D may include a first sub-pixel 112D, a second sub-pixel 114D, and a third sub-pixel 116D. However, the number of pixels and the number of sub-pixels described in this embodiment are only for illustration, and are not intended to limit the scope of the disclosure.

In FIG. 3, one pixel block PX1 in the display panel is displayed, and four pixels 110 are arranged in one pixel block. The display panel may include a plurality of repeated pixel blocks PX1. For the convenience of description, only one pixel block is shown in FIG. 3. The sub-pixels of the same color arranged along the second direction D2 may be provided with signals through a same data line. In detail, the first sub-pixels 112 in the first pixel 110A and in the second pixel 110B may have the same color (for example, red), and may be provided with signals through the signal line 134 (data line). The second sub-pixels 114 in the first pixel 110A and in the second pixel 110B may have the same color (for example, green) and may be provided with signals through the signal line 136 (data line). The third sub-pixels 116 in the first pixel 110A and in the second pixel 110B may have the same color (for example, blue) and may be provided with signals through the signal line 138 (data line).

Since the display panel may include a plurality of repeated pixel blocks PX1, there may be repeated signal lines 134, 136, 138 (data lines) on a right side of FIG. 3 that is not shown, and repeated signal lines 132 (scan lines) on a top portion of FIG. 3 that is not shown. One pixel block PX1 may be defined as a region surrounded by adjacent scan lines and adjacent data lines that provide the same color signal. In FIG. 3, the adjacent data lines providing the same color signal may be the signal line 134 and a signal line 134 (data line) that is repeated on the right side of FIG. 3 which is not shown, both of which provide signals to the first sub-pixel (red). To be specific, in FIG. 3, the pixel block PX1 may be defined as a region surrounded by the signal line 134 (data line), the signal line 134 (data line) repeated on the right side of FIG. 3 that is not shown, the signal line 132 (scan line), and a signal line 132 (scan line) repeated on the top portion FIG. 3 that is not shown, for example, a region encircled by the dotted lines.

According to some embodiments, the pixel block PX1 may be defined by the light-shielding layer 170 in the counter substrate 100S2. Referring to FIG. 3 and FIG. 7 together, a light-shielding layer 170 in the counter substrate 100S2 is configured at positions corresponding to the signal lines 134, 136, 138 and the signal lines 132 in FIG. 3 (FIG. 7). In this way, the light-shielding layer 170 has an edge 170S1 at the corresponding position of the signal line 134 (data line), and has an edge 170S2 at the corresponding position of the signal line 132 (scan line). As described above, the display panel may include a plurality of repeated pixel blocks PX1, so that on the right side and the top portion of FIG. 7 that are not shown, there are other pixel blocks, which also have the same edges 170S1 and 170S2 of the light-shielding layer 170. One pixel block PX1 may be defined as a region surrounded by the edge 170S1 of the light-shielding layer 170 configured corresponding to the data line, a next same edge 170S1 along the first direction D1, an edge 170S2 configured corresponding to the scan line, and a next same edge 170S2 along the second direction D2, for example, the region encircled by the dotted lines.

In FIG. 3, the electronic device 10 further includes a first conductive connection element 140, and the first sub-pixel electrodes PE1 of the first sub-pixels 112 of the plurality of pixels 110 may be electrically connected to each other through the first conductive connection element 140. In detail, each of the first sub-pixels may include a first sub-pixel electrode. The plurality of pixels 110 may include the first pixel 110A and the second pixel 110B, and the first sub-pixel electrode PE1 of the first sub-pixel 112A of the first pixel 110A may be electrically connected to the first sub-pixel electrode PE1 of the first sub-pixel 112B of the second pixel 110B through the first conductive connection element 140.

For example, the first conductive connection element 140 may include a portion 142, a portion 144 and a portion 146. The portion 142 is connected between the first sub-pixel electrode PE1 of the first sub-pixel 112A and the first sub-pixel electrode PE1 of the first sub-pixel 112B, the portion 144 is connected between the first sub-pixel electrode PE1 of the first sub-pixel 112B and the first sub-pixel electrode PE1 of the first sub-pixel 112B, and the portion 146 is connected between the first sub-pixel electrode PE1 of the first sub-pixel 112C and the first sub-pixel electrode PE1 of the first sub-pixel 112D. In this way, the first sub-pixel electrodes PE1 of the first sub-pixel 112A, the first sub-pixel 112B, the first sub-pixel 112C and the first sub-pixel 112D may be electrically connected to each other in series. According to some embodiments, the portion 142 and the portion 146 may extend along the second direction D2, a part of the portion 144 may extend along the first direction D1, and another part of the portion 144 may extend along the second direction D2, but the disclosure is not limited thereto.

Figure 4A:
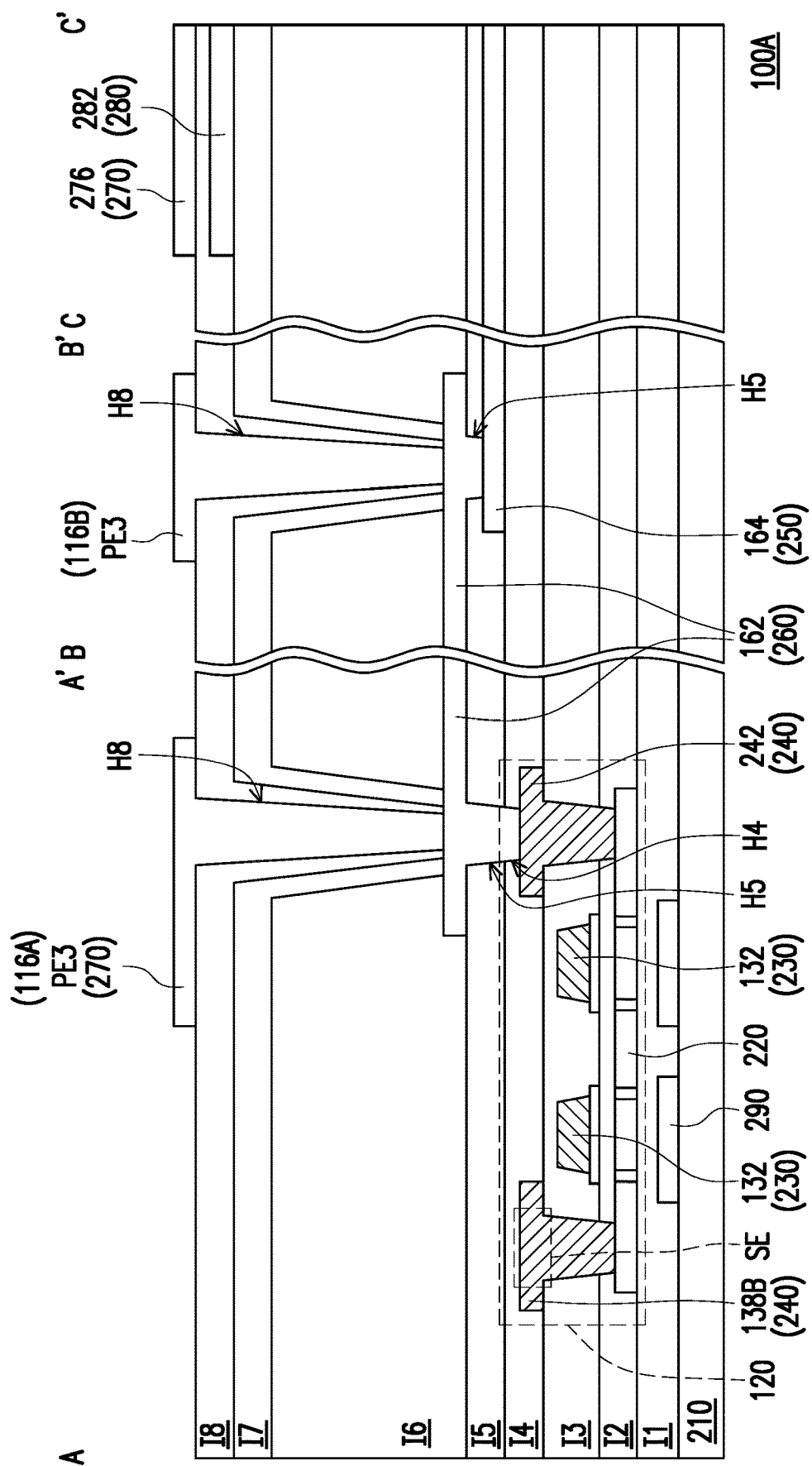
FIG. 4A is a schematic cross-sectional view of the array substrate of FIG. 3 taken along a line A-A', a line B-B', and a line C-C' in some embodiments.
Figure 4B:
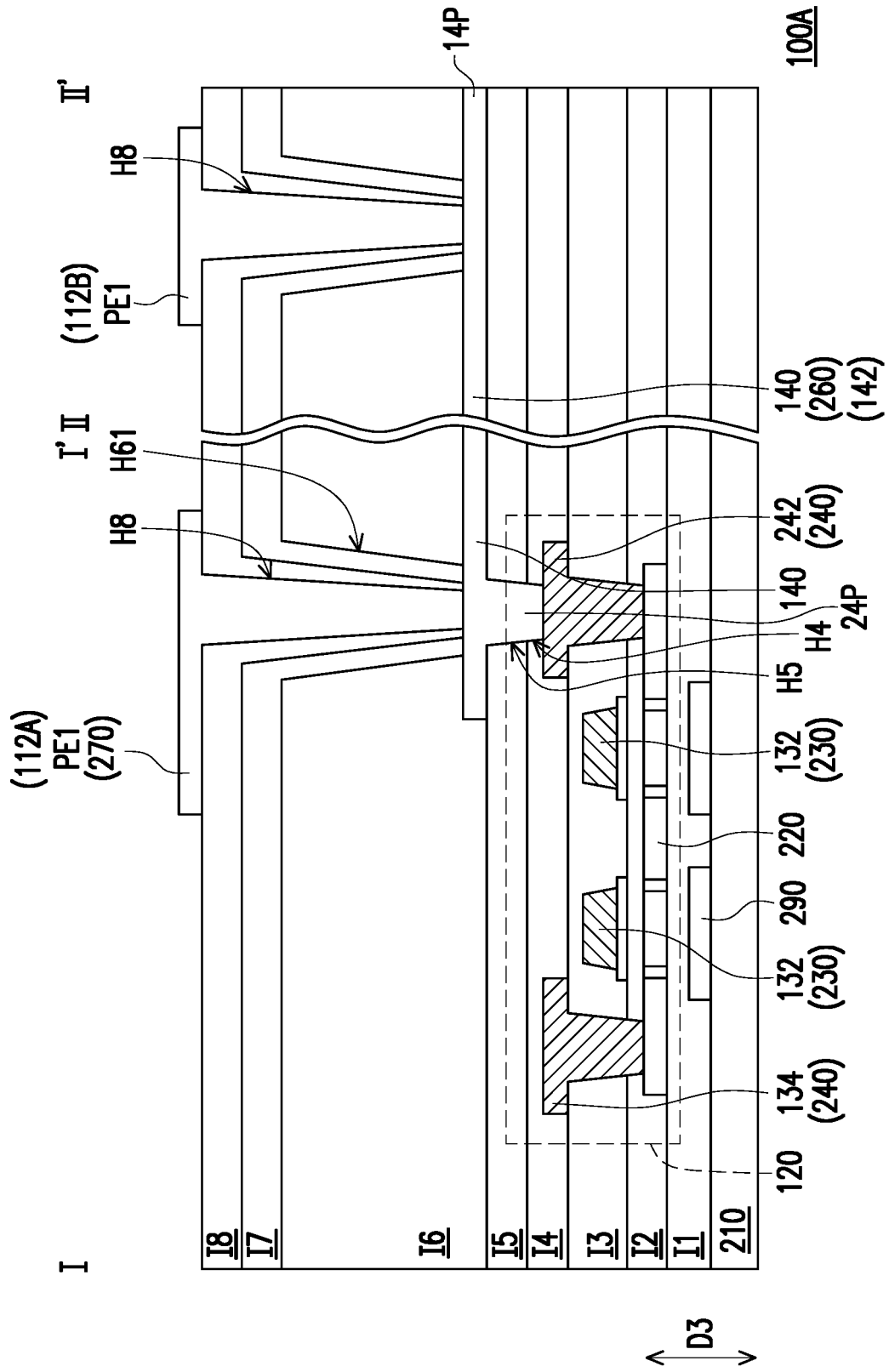
FIG. 4B is a schematic cross-sectional view of the array substrate of FIG. 3 taken along a line I-I' and a line II-II' of FIG. 3 in some embodiments.

FIG. 4B is a schematic cross-sectional view taken along a line I-I' and a line II-II' of FIG. 3. As shown in FIG. 4B, in a thickness direction D3 of the array substrate 100A, at least a part of the first conductive connection element 140 is disposed between the driving element 120 and the first sub-pixel electrode PE1. According to some embodiments, the first conductive connection element 140 may be transparent. The first conductive connection element 140 may include a transparent material, for example, indium tin oxide (ITO). According to some embodiments, the first conductive connection element 140 may be opaque, for example, may include an opaque material, such as metal. According to some embodiments, the first conductive connection element 140 may include a transparent portion and an opaque portion. The portion 142, the portion 144 and the portion 146 in the first conductive connection element 140 may be made of the same material or different materials. According to some embodiments, the portion 142, the portion 144, and the portion 146 may be made of the same material, and may be a transparent material. According to some embodiments, the portion 142 may be an opaque material, and the portions 144 and 146 may be a transparent material. As shown in FIG. 4B, the part of the signal line 132 (scan line) overlapping an active layer may be used as a gate electrode, and the part of the signal line 134 (data line) connected to the active layer may be used as a source electrode. In this way, the active layer 220, the gate electrode 132, the source electrode 134, and a drain electrode 242 may constitute a thin film transistor, which may be used as a specific example of the driving element 120. According to some embodiments, the active layer 220 may be a semiconductor such as polysilicon, amorphous silicon, or indium gallium zinc oxide (IGZO).

The electronic device 10 further includes a second conductive connection element 150, and the second sub-pixel electrodes of the second sub-pixels 114 of the plurality of pixels 110 may be electrically connected to each other through the second conductive connection element 150. Similar to the first conductive connection element 140 described above, in detail, each of the second sub-pixels 114 may include the second sub-pixel electrode PE2. The plurality of pixels 110 may include the first pixel 110A and the second pixel 110B, and the second sub-pixel electrode PE2 of the second sub-pixel 114A of the first pixel 110A may be electrically connected to the second sub-pixel electrode PE2 of the second sub-pixel 114B of the second pixel 110B through the second conductive connection element 150. The second conductive connection element 150 may include a portion 152 connected between the second sub-pixel 114A and the second sub-pixel 114B, a portion 154 connected between the second sub-pixel 114B and the second sub-pixel 114C, and a portion 156 connected between the second sub-pixel 114C and the second sub-pixel 114D. In this way, the second sub-pixel electrode of the second sub-pixel 114A, the second sub-pixel electrode of the second sub-pixel 114B, the second sub-pixel electrode of the second sub-pixel 114C, and the second sub-pixel electrode of the second sub-pixel 114D may be electrically connected to each other. The portions 152, 154, 156 in the second conductive connection element 150 may be made of the same material or different materials, and may be of the same layer or different layers. According to some embodiments, the portions 152 and 156 may be of the same layer, and the portions 152 and 154 may be of different layers. In addition, in the thickness direction of the array substrate 100A, at least a part of the second conductive connection elements 150 may be disposed between the second sub-pixel electrode of the second sub-pixel 114A and the corresponding driving element 120, so that the corresponding driving element 120 may simultaneously drive four sub-pixels of the second sub-pixel 114A, the second sub-pixel 114B, the second sub-pixel 114C, and the second sub-pixel 114D. Materials suitable for the second conductive connection element 150 are similar to those of the first conductive connection element 140, and detail thereof is not repeated.

The electronic device 10 further includes a third conductive connection element 160, and the third sub-pixel electrodes of the third sub-pixels 116 of the plurality of pixels 110 may be electrically connected to each other through the third conductive connection element 160. Similar to the first conductive connection element 140, the third conductive connection element 160 may include a portion 162 connected between the third sub-pixel 116A and the third sub-pixel 116B, a portion 164 connected between the third sub-pixel 116B and the third sub-pixel 116C, and a portion 166 connected between the third sub-pixel 116C and the third sub-pixel 116D. In this way, the third sub-pixel electrode of the third sub-pixel 116A, the third sub-pixel electrode of the third sub-pixel 116B, the third sub-pixel electrode of the third sub-pixel 116C, and the third sub-pixel electrode of the third sub-pixel 116D may be electrically connected to each other. The portions 162, 164, 166 in the third conductive connection element 160 may be made of the same material or different materials, and may be of the same layer or different layers. According to some embodiments, the portions 162 and 166 may be of the same layer, and the portions 162 and 164 may be of different layers. In addition, in the thickness direction of the array substrate 100A, at least a part of the third conductive connection elements 160 may be disposed between the third sub-pixel electrode of the third sub-pixel 116A and the corresponding driving element 120, so that the corresponding driving element 120 may simultaneously drive four sub-pixels of the third sub-pixel 116A, the third sub-pixel 116B, the third sub-pixel 116C and the third sub-pixel 116D. Materials suitable for the third conductive connection element 160 are similar to those of the first conductive connection element 140, and detail thereof is not repeated. The first conductive connection element 140, the second conductive connection element 150, and the third conductive connection element 160 may be made of the same material, or different materials, which are not limited by the disclosure.

In some embodiments, the first pixel 110A, the second pixel 110B, the third pixel 110C, and the fourth pixel 110D are spaced apart from each other to form a transparent portion RT among the first pixel 110A, the second pixel 110B, the third pixel 110C and the fourth pixel 110D. The sub-pixel electrodes of all sub-pixels and all conductive connection elements connected between the sub-pixel electrodes may be made of transparent conductive materials. According to some embodiments, at least one of the first conductive connection element 140, the second conductive connection element 150, and the third conductive connection element 160 described above may include a transparent conductive material. For example, the first conductive connection element 140 may include a transparent conductive material. In this way, as shown in FIG. 3, although the conductive connection elements extend between the sub-pixels and pass through the transparent portion RT, the conductive connection elements do not block light. In other words, the arrangement of the conductive connection elements does not affect the transmission property, which helps to maintain the light transmission property of the display panel in the transparent region R1 of FIG. 2.

In this embodiment, the portion 144 of the first conductive connection element 140 may be overlapped with the second sub-pixel electrode PE2 of the second sub-pixel 114B and the third sub-pixel electrode PE3 of the third sub-pixel 116B. The portion 154 of the second conductive connection element 150 may be overlapped with the portion 144 of the first conductive connection element 140 and the third sub-pixel electrode PE3 of the third sub-pixel 116B. The portion 164 of the third conductive connection element 160 may be overlapped with the portion 144 of the first conductive connection element 140 and the portion 156 of the second conductive connection element 150, the first sub-pixel electrode PE1 of the first sub-pixel 112C and the second sub-pixel electrode PE2 of the second sub-pixel 116C. Therefore, in this embodiment, a plurality of transparent conductive layers may be used to form the sub-pixel electrodes and the conductive connection elements. For example, the portion 154 of the second conductive connection element 150 and the portion 164 of the third conductive connection element 160 may be formed of a same transparent conductive layer (for example, a first transparent conductive layer). The whole first conductive connection element 140, the portion 152 and the portion 156 of the second conductive connection element 150 and the portion 162 and the portion 166 of the third conductive connection element 160 may be formed of a same transparent conductive layer (for example, a second transparent conductive layer), while the sub-pixel electrodes of the first sub-pixel 112, the second sub-pixel 114 and the third sub-pixel 116 may be formed of a same transparent conductive layer (for example, a third transparent conductive layer). According to some embodiments, the portion 144 of the first conductive connection element 140 and the portion 156 of the second conductive connection element 150 may be of different conductive layers, and may have a partial overlap portion. According to some embodiments, the portion 144 of the first conductive connection element 140 and the portion 164 of the third conductive connection element 150 may be of different conductive layers, and may have a partial overlap portion.

FIG. 4A is a schematic cross-sectional view of the array substrate of FIG. 3 taken along a line A-A', a line B-B', and a line C-C' in some embodiments. FIG. 4B is a schematic cross-sectional view of the array substrate of FIG. 3 along the line I-I' and the line II-II' of FIG. 3 in some embodiments. To be specific, the film layers of FIG. 4B are substantially the same as the film layers of FIG. 4A, but FIG. 4A and FIG. 4B present cross-sections of different parts. To be specific, FIG. 4A may represent a connection relationship between the third sub-pixel 116A and the third sub-pixel 116B, and FIG. 4B may represent a connection relationship between the first sub-pixel 112A and the first sub-pixel 112B.

In FIG. 4A and FIG. 4B, the array substrate 100A includes a substrate 210, an active layer 220, a first metal layer 230, a second metal layer 240, a first transparent conductive layer 250, a second transparent conductive layer 260, and a third transparent conductive layer 270 and a fourth transparent conductive layer 280. To be specific, the array substrate 100A further includes a shielding layer 290 disposed between the active layer 220 and the substrate 210, and a plurality of insulating layers I1-I8 disposed between the above film layers.

The shielding layer 290 is disposed on the substrate 210. The insulating layer I1 covers the shielding layer 290. The active layer 220 is disposed on the insulating layer I1, and the shielding layer 290 is overlapped with at least a partial region of the active layer 220 in a thickness direction. The insulating layer I2 is disposed on the active layer 220 to cover the active layer 220. The first metal layer 230 is disposed on the insulating layer I2 and a part of the first metal layer 230 may be disposed corresponding to the shielding layer 290 and located on two opposite sides of the active layer 220. In some embodiments, the first metal layer 230 may be patterned to define the signal line 132 in FIG. 3, and the part of the signal line 132 overlapping the active layer 220 may act as a gate electrode. In some embodiments, the first metal layer 230 (M1) may be patterned to further define a portion 138A of the signal line 138 of FIG. 3. The insulating layer I3 is disposed on the first metal layer 230, and the second metal layer 240 is disposed on the insulating layer I3. The second metal layer 240 (M2) may be patterned to define a portion 138B of the signal line 134 and the signal line 138 of FIG. 3 that traverse the first metal layer 230. In this way, the signal line 138 may be composed of two metal layers. Although not shown in FIG. 4A and FIG. 4B, the second metal layer 240 may further define the signal line 136 of FIG. 3. In addition, the second metal layer 240 further includes a drain electrode 242 and a source electrode SE integrated in the signal lines 134 and 138. The source electrode SE and the drain electrode 242 may be connected to different parts of the active layer 220 through corresponding holes (penetrating through the insulating layer I2 and the insulating layer I3). In this way, as shown in FIG. 3 and FIG. 4B, the active layer 220, a part of the signal line 132, a part of the signal line 134 and the drain electrode 242 may constitute the driving element 120, such as a thin film transistor. The thin film transistor described in this embodiment may be used as an implementation of the driving element 120 in FIG. 3, but the disclosure is not limited thereto. In this embodiment, the driving element 120 of FIG. 4A is connected to the signal line 138, and the driving element 120 of FIG. 4B is connected to the signal line 134, so that the two signal lines may be driven independently.

The insulating layer I4 may cover the driving element 120, and the first transparent conductive layer 250 may be disposed on the insulating layer I4. The first transparent conductive layer 250 may be patterned to define the portion 154 of the second conductive connection element 150 and the portion 164 of the third conductive connection element 160 in FIG. 3, although the cross-sections of FIG. 4A and FIG. 4B only show the portion 164 of the third conductive connection element 164. The insulating layer I5 covers the first transparent conductive layer 250 and the second transparent conductive layer 260 is disposed on the insulating layer I5. The second transparent conductive layer 260 may be patterned to define the entirety of the first conductive connection element 140, the portions 152 and 156 of the second conductive connection element 150, and the portions 162 and 166 of the third conductive connection element 160 in FIG. 3, although the cross-sections of FIG. 4A and FIG. 4B only show the first conductive connection element 140 and the portion 162 of the third conductive connection element 160. The insulating layer I6, the insulating layer I7 and the insulating layer I8 are sequentially disposed on the second transparent conductive layer 260, and a thickness of the insulating layer I6 (referred to as a first insulating layer hereinafter) may be thicker than other insulating layers to provide a planarization effect, but the disclosure is not limited thereto.

The third transparent conductive layer 270 is disposed on the insulating layer I8. The third transparent conductive layer 270 may be patterned to define the first sub-pixel electrode PE1 of the first sub-pixel 112, the second sub-pixel electrode PE2 of the second sub-pixel 114, and the third sub-pixel electrode PE3 of the third sub-pixel 116. The cross-section of FIG. 4A shows the sub-pixel electrode PE3 of the third sub-pixel 116A and the sub-pixel electrode PE3 of the third sub-pixel 116B defined by the third transparent conductive layer 270, and the cross-section of FIG. 4B shows the sub-pixel electrode PE1 of the first sub-pixel 112A and the sub-pixel electrode PE1 of the first sub-pixel 112B defined by the third transparent conductive layer 270. Moreover, the third transparent conductive layer 270 defines a transparent portion electrode 276 in the cross-sectional structure of the line C-C'. In this embodiment, the fourth transparent conductive layer 280 is disposed between the insulating layer I7 and the insulating layer I8, and the fourth transparent conductive layer 280 defines a transparent portion electrode 282 in the cross-sectional structure of the line C-C'. The transparent portion electrode 282 may be located in the transparent portion RT of FIG. 2. In some embodiments, the fourth transparent conductive layer 280 may define a common electrode in the region where the sub-pixels are located and may be disposed opposite to the corresponding sub-pixel electrode, so as to generate a driving electric field that may drive a display medium.

In this embodiment, the first sub-pixel electrode PE1 of the first sub-pixel 112A of one of the plurality of pixels 110 (the first pixel 110A) may be electrically connected to the first sub-pixel electrode PE1 of the first sub-pixel 112B of another one of the plurality of pixels 110 (the second pixel 110B) through the first conductive connection element 140. The third sub-pixel electrode PE3 of the third sub-pixel 116A of one of the plurality of pixels 110 (the first pixel 110A) may be electrically connected to the third sub-pixel electrode PE3 of the third sub-pixel 116B of another one of the plurality of pixels 110 (the second pixel 110B) through the third conductive connection element 160.

As shown in FIG. 4B, the first insulating layer I6 is disposed between the first sub-pixel electrode PE1 and the first conductive connection element 140, and the first insulating layer I6 includes a first hole H61. The first sub-pixel electrode PE1 may be electrically connected to the first conductive connection element 140 through the first hole H61. In addition, the insulating layer I8 between the first sub-pixel electrode PE1 and the first conductive connection element 140 further includes a hole H8, and the first sub-pixel electrode PE may be electrically connected to the first conductive connection element 140 through the hole H8. The hole H8 may be located within the first hole H61. The first insulating layer I6 may be a planarization layer and may be disposed between the driving element 120 and the first sub-pixel electrode PE1. The first insulating layer I6 may be made of an organic material, an inorganic material, or a combination thereof.

In addition, in order to achieve the required electrical connection, the first sub-pixel electrode PE1 of the first sub-pixel 112A and a part of the first sub-pixel electrode PE1 of the first sub-pixel 112B may extend to the corresponding first hole H61 to electrically connect the corresponding first conductive connection element 140. The third sub-pixel electrode PE3 of the third sub-pixel 116A and the third sub-pixel electrode PE3 of the third sub-pixel 116B may respectively extend to the corresponding first hole H61 to electrically connect the corresponding third conductive connection element 160. Similarly, the second conductive connection element 150 and the second sub-pixel electrode of the respective second sub-pixel 114A may also be electrically connected to each other by a similar structure.

In addition, as shown in FIG. 4B, the second insulating layer I5 is disposed under the first insulating layer I6, the second insulating layer I5 includes a third hole H5, and the first conductive connection element 140 includes a first portion 14P and a second portion 24P, and the first portion 14P may be electrically connected to the second portion 24P through the third hole H5.

Figure 5:
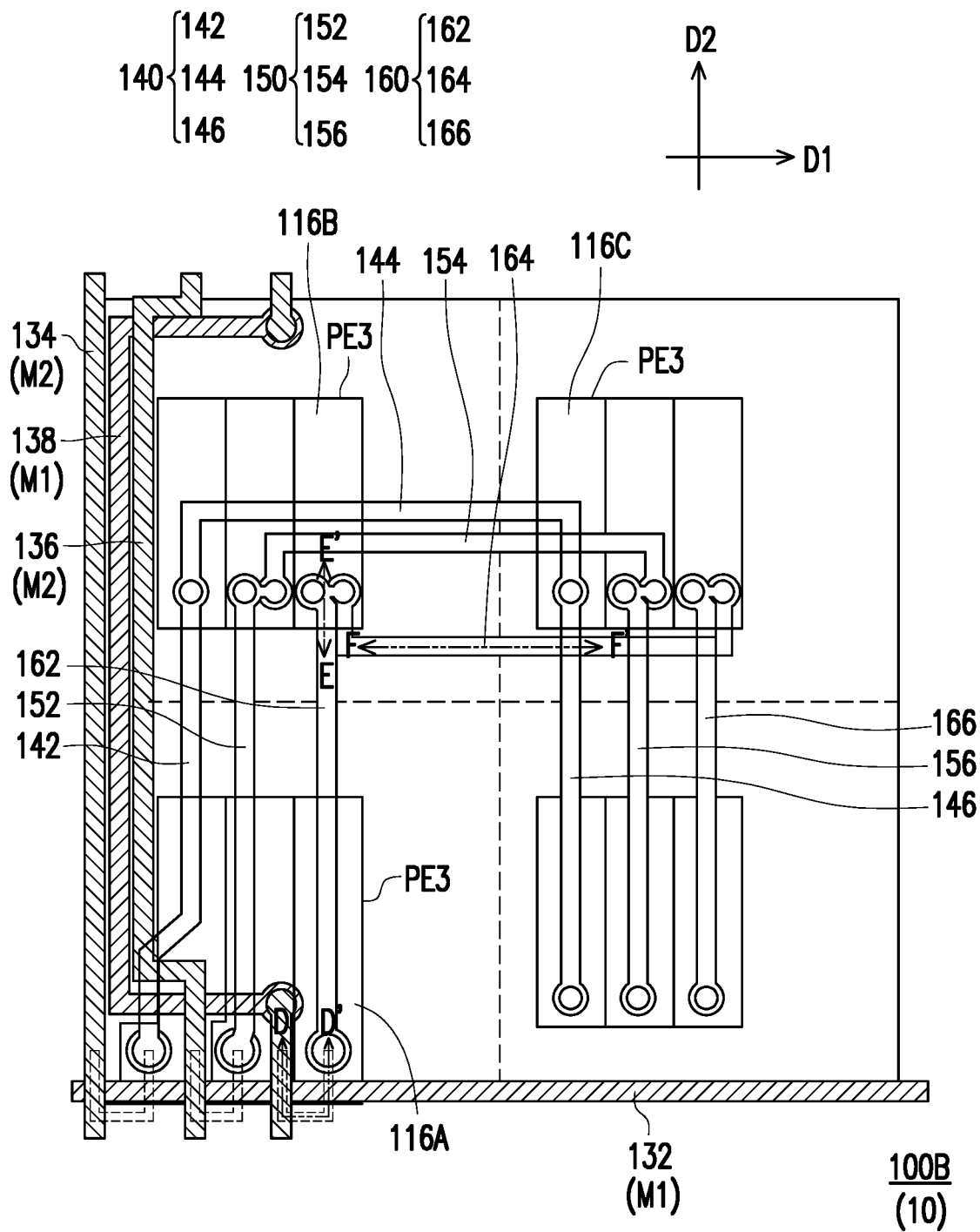
FIG. 5 is a partial schematic diagram of an array substrate according to an embodiment of the disclosure.

FIG. 5 is a partial schematic diagram of an array substrate according to an embodiment of the disclosure. To be specific, FIG. 5 shows one of the pixel blocks of the display panel in the transparent region. The structure shown in FIG. 5 is substantially the same as that shown in FIG. 3, and the same component symbols in FIG. 3 and FIG. 5 represent the same components, so description thereof is not repeated herein. The difference between the array substrate 100B of FIG. 5 and the array substrate 100A of FIG. 3 is mainly in the layout of the conductive connection elements. To be specific, in the array substrate 100B of FIG. 5, the portion 144 of the first conductive connection element 140 may be overlapped with the portion 154 of the second conductive connection element 150, and the portion 164 of the third conductive connection element 160 may be overlapped with the portion 146 of the first conductive connection element 140 and the portion 156 of the second conductive connection element 150. Therefore, the portion 154 of the second conductive connection element 150 and the portion 164 of the third conductive connection element 160 may be selected from film layers different from those of the first conductive connection element 140 and other portions.

Figure 6:
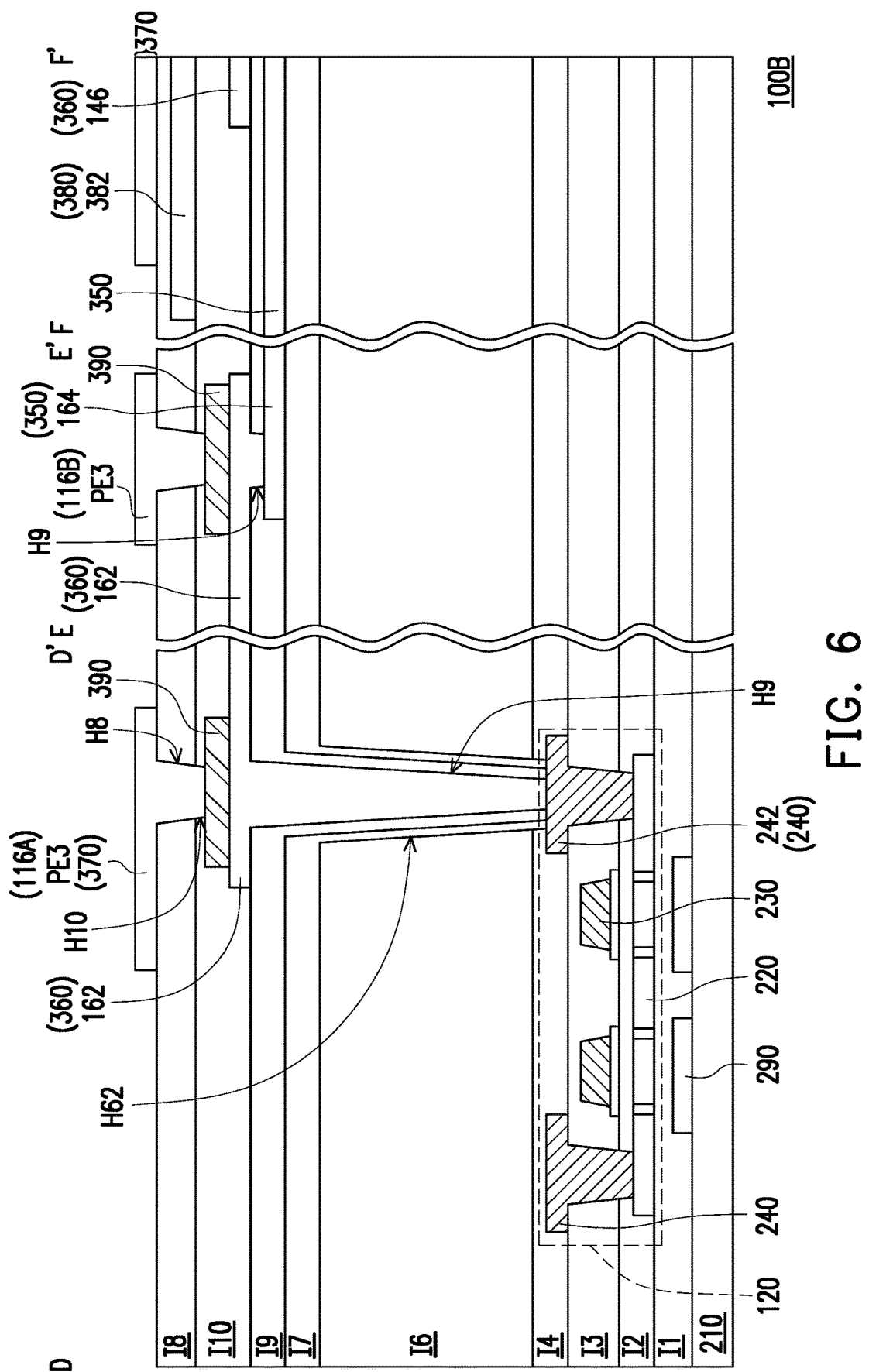
FIG. 6 is a schematic diagram of a cross-sectional structure of the array substrate of FIG. 5 taken along a line D-D', a line E-E', and a line F-F' in some embodiments.

For example, FIG. 6 is a schematic diagram of a cross-sectional structure of the array substrate of FIG. 5 taken along a line D-D', a line E-E', and a line F-F' in some embodiments. The structure of FIG. 6 is substantially similar to that of FIG. 4B, so that the same reference numerals in the two embodiments represent the same components, and description thereof is not repeated herein. To be specific, the difference between the embodiment of FIG. 6 and the embodiment of FIG. 4B lies in the level relationship of the conductive layers. The cross-sectional structure of FIG. 6 includes a substrate 210, an active layer 220, a first metal layer 230, a second metal layer 240, a first transparent conductive layer 350, a second transparent conductive layer 360, a third transparent conductive layer 370, a fourth transparent conductive layer 380, a shielding layer 290, a third metal layer 390, insulating layers I1-I4, and insulating layers I7-I10. Regarding The configuration relationships of the active layer 220, the first metal layer 230, the second metal layer 240, and the insulating layers I1-I4, in this embodiment, the active layer 220, the first metal layer 230, and the second metal layer 240 may constitute the driving element 120. The specific structure and configuration of the driving element 120 may be found with reference to the description of FIG. 4B, and details thereof are not repeated. In this embodiment, the thicker insulating layer I6 is directly disposed on the insulating layer I4, the insulating layer I9 and the third metal layer 390 are disposed between the insulating layer I7 and the insulating layer I10, and the insulating layer I10 is disposed between the insulating layer I9 and the insulating layer I8. In addition, in this embodiment, all of the transparent conductive layers are formed on the insulating layer I7 and formed after the thicker insulating layer I6. In detail, the first transparent conductive layer 350, the second transparent conductive layer 360, the third transparent conductive layer 370, and the fourth transparent conductive layer 380 are disposed on the first insulating layer I6.

In FIG. 6, the first transparent conductive layer 350 is disposed on the insulating layer I7, the insulating layer I9 covers the first transparent conductive layer 350, the second transparent conductive layer 360 is disposed on the insulating layer I9, and the third metal layer 390 is disposed on the on the second transparent conductive layer 360. The insulating layer I10 covers the second transparent conductive layer 360 and the third metal layer 390, and the fourth transparent conductive layer 380 is disposed on the insulating layer I10. The insulating layer I8 covers the fourth transparent conductive layer 380, and the third transparent conductive layer 370 is disposed on the insulating layer I8.

In the cross section taken along the line D-D', the third sub-pixel electrode PE3 of the third sub-pixel 116A defined by the third transparent conductive layer 370 may be electrically connected to a part of the third sub-pixel electrode PE3 through the holes H8 and H10 of the insulating layer I8 and the insulating layer I10, and is electrically connected to the portion 162 of the third conductive connection element 160 defined by the second transparent conductive layer 360 through the third metal layer 390. The portion 162 of the third conductive connection element 160 defined by the second transparent conductive layer 360 may be connected to the drain electrode 242 defined by the second metal layer 240 through the second hole H62 of the first insulating layer I6 and through the hole H9 of the insulating layer I9, so as to achieve the desired electrical connection.

In the cross section taken along the line E-E', the third sub-pixel electrode PE3 of the third sub-pixel 116B defined by the third transparent conductive layer 370 may be electrically connected to another part of the third metal layer 390 through the corresponding holes H8 and H10 in the insulating layer I8 and the insulating layer I10, and is electrically connected to the portion 162 of the third conductive connection element 160 defined by the second transparent conductive layer 360 through the third metal layer 390. The portion 162 of the third conductive connection element 160 may be electrically connected to the portion 164 of the third conductive connection element 160 defined by the first transparent conductive layer 350 through another hole H9 of the insulating layer I9. In the cross section along the line F-F', the portion 164 of the third conductive connection element 160 defined by the first transparent conductive layer 350 may be overlapped with and traverse the portion 146 of the first conductive connection element 140 defined by the second transparent conductive layer 360. In addition, the fourth transparent conductive layer 380 defines a transparent portion electrode 382, and the configuration of the transparent portion electrode 382 is substantially similar to the aforementioned transparent portion electrode 282.

As shown in FIG. 6, the first insulating layer I6 is disposed between the driving element 120 and the first conductive connection element 162. The first insulating layer I6 includes a second hole H62, and the first conductive connection element 162 is electrically connected to the driving element 120, for example, electrically connected to the source electrode or the drain electrode 242 of the driving element 120 through the second hole H62.

FIG. 7 is a schematic diagram of some components of the counter substrate 100S2 according to an embodiment of the disclosure. The components disclosed in FIG. 7 may correspond to the structures in FIG. 3 or FIG. 5 to form a display panel, but the disclosure is not limited thereto. In addition, FIG. 7 substantially shows the pixel blocks of the display panel in the transparent region. To be specific, FIG. 7 shows the light-shielding layer 170 and the color filter layer 180 of the display panel. The light-shielding layer 170 may be a black matrix. A distribution of the light-shielding layer 170 may correspond to the driving element 120 and the signal line 130 in FIG. 3 to cover the driving element 120 and the signal line 130, and the light-shielding layer 170 has a plurality of openings P170, and the sub-pixels may be defined by the openings P170 of the light-shielding layer 170. For example, referring to the lower left of FIG. 7, the three openings of the light-shielding layer 170 define the first sub-pixel P1A, the second sub-pixel P1B, and the third sub-pixel P1C.

As shown in FIG. 7, the color filter layer 180 includes a first color pattern 182, a second color pattern 184 and a third color pattern 186, and the first color pattern 182, the second color pattern 184 and the third color pattern 186 are respectively within the corresponding openings P170. With reference of the structures shown in FIG. 3 (or FIG. 5) and FIG. 7, the first color pattern 182 may be provided in the opening P170 corresponding to the first sub-pixel 112, the second color pattern 184 may be provided in the opening P170 corresponding to the second sub-pixel 114, and the third color pattern 186 may be provided in the opening P170 corresponding to the third sub-pixel 116. The first color pattern 182, the second color pattern 184, and the third color pattern 186 may include filter materials of different colors to achieve a full-color display effect. In addition, the light-shielding layer 170 may vacate a part of the region to define the transparent portion RT, so that the display panel has a good light transmission property in the transparent portion RT. In some embodiments, the light-shielding layer 170 and the color filter layer 180 of FIG. 7 may be applied to the pixel block PX1 in the transparent region R1 of FIG. 2, and the regions other than the light-shielding layer 170 and the color filter layer 180 construct the transparent portion RT.

Figure 8:
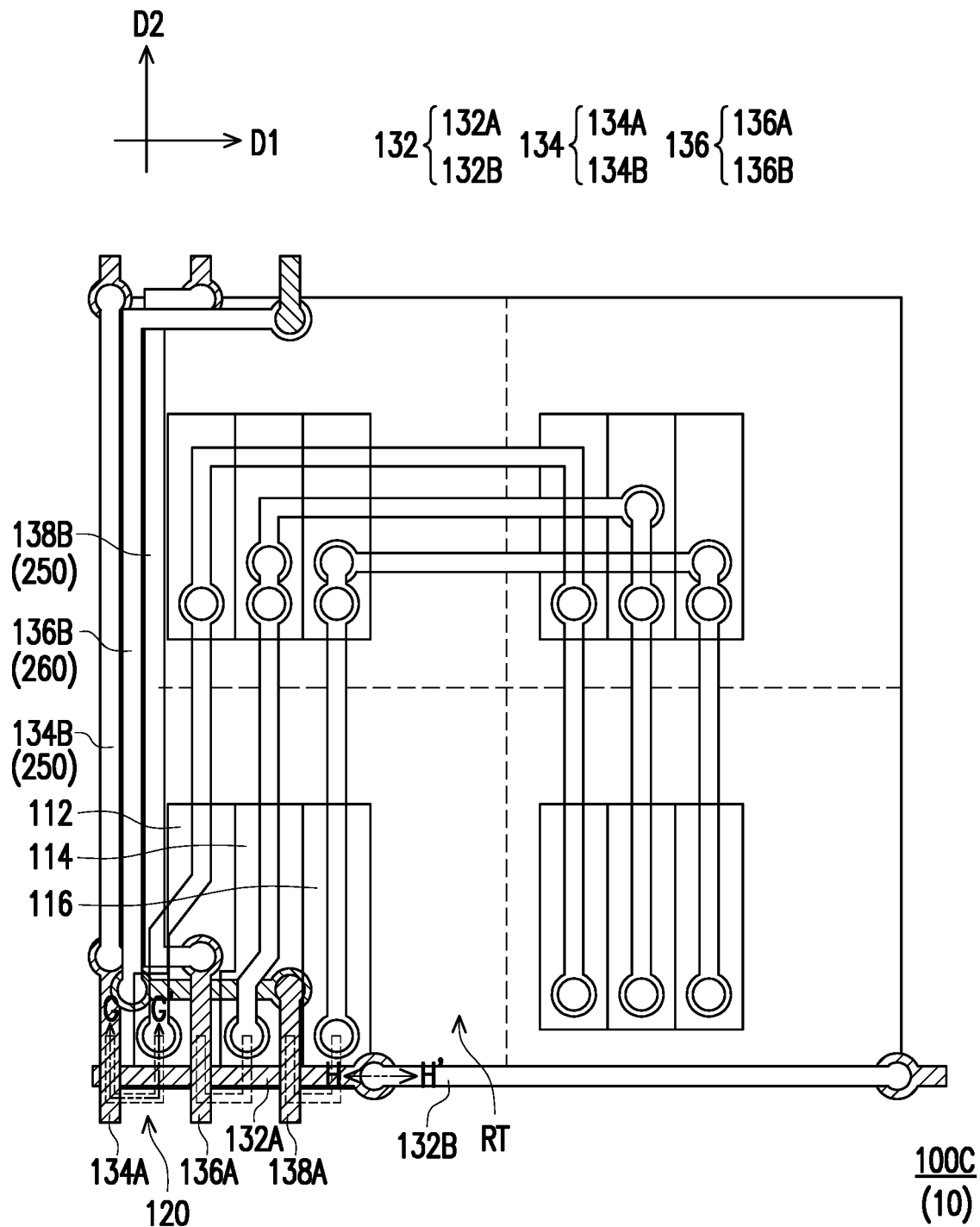
FIG. 8 is a partial schematic diagram of an array substrate according to an embodiment of the disclosure.

FIG. 8 is a partial schematic diagram of an array substrate according to an embodiment of the disclosure. To be specific, FIG. 8 shows the pixel blocks of the display panel in the transparent region, and the structure shown in FIG. 8 is substantially the same as that shown in FIG. 3. The same components in FIG. 3 and FIG. 8 represent the same components, and description thereof is not repeated herein. According to FIG. 8, the difference between the array substrate 100C and the array substrate 100A in FIG. 3 is mainly in the materials of the signal line 132, the signal line 134, the signal line 136, and the signal line 138. The signal line 132 may include a transparent conductive material. The signal line 132 may be a scan line, which extends along the first direction D1. The signal lines 134, 136, and 138 may be data lines, and may extend along the second direction D2. The signal line 132 may be electrically connected to the driving element 120 and may include a transparent conductive material. To be specific, the signal line 132 includes a segment 132A and a segment 132B, a part of the segment 132A may constitute a driving element, and the segment 132B does not constitute a driving element. The segment 132B may include a transparent conductive material. Similarly, the signal line 134 may include a segment 134A and a segment 134B, the signal line 136 may include a segment 136A and a segment 136B, and the signal line 138 may include a segment 138A and a segment 138B. The segment 134A is connected between the corresponding driving element 120 and the segment 134B, the segment 136A is connected between the corresponding driving element 120 and the segment 136B, and the segment 138A is connected between the corresponding driving element 120 and the segment 138B. In addition, the segment 132B, the segment 134B, the segment 136B and the segment 138B are all made of transparent conductive materials and all extend to the side of the pixel block. Therefore, the region where the segment 134B, the segment 136B and the segment 138B are located has light transmittance and may be used as the transparent portion RT.

Figure 9:
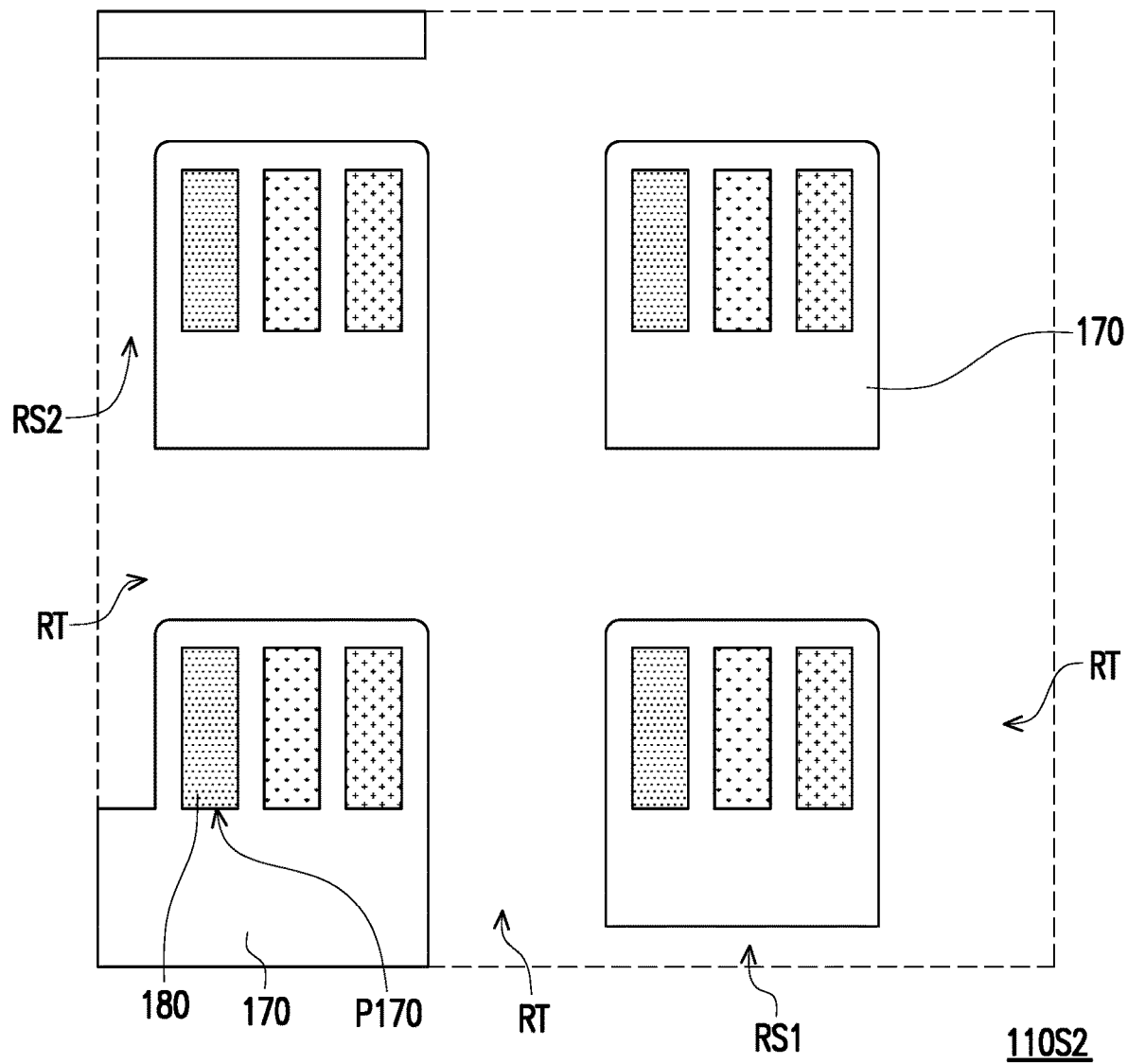
FIG. 9 is a schematic diagram of some elements of a counter substrate according to an embodiment of the disclosure.

FIG. 9 is a schematic diagram of some components of the counter substrate 100S2 according to an embodiment of the disclosure. The counter substrate 100S2 disclosed in FIG. 9 may correspond to the array substrate 100C of FIG. 8 to form the display panel 12, but the disclosure is not limited thereto. To be specific, FIG. 9 shows the light-shielding layer 170 and the color filter layer 180 in the counter substrate 100S2. A distribution of the light-shielding layer 170 may correspond to the driving element 120 and the signal line 130 in FIG. 3 to cover the driving element 120, the segment 132A of the signal line 132, the segment 134A of the signal line 134, the segment 136A of the signal line 136 and the segment 138A of the signal line 138. In addition, a part of the light-shielding layer 170 may be correspondingly disposed on the periphery of the first sub-pixel 112, the second sub-pixel 114 and the third sub-pixel 116 to surround a plurality of openings P170. The color patterns of the color filter layer 180 are respectively located in the corresponding openings P170. Referring to FIG. 8 and FIG. 9 together, it is learned that the light-shielding layer 170 may not shield the segment 132B, the segment 134B, the segment 136B and the segment 138B so as to increase an area ratio of the light-transmitting region of the display panel 12. In other words, the region where the segment 132B, the segment 134B, the segment 136B and the segment 138B are located may also constitute a part of the transparent portion RT.

Figure 10:
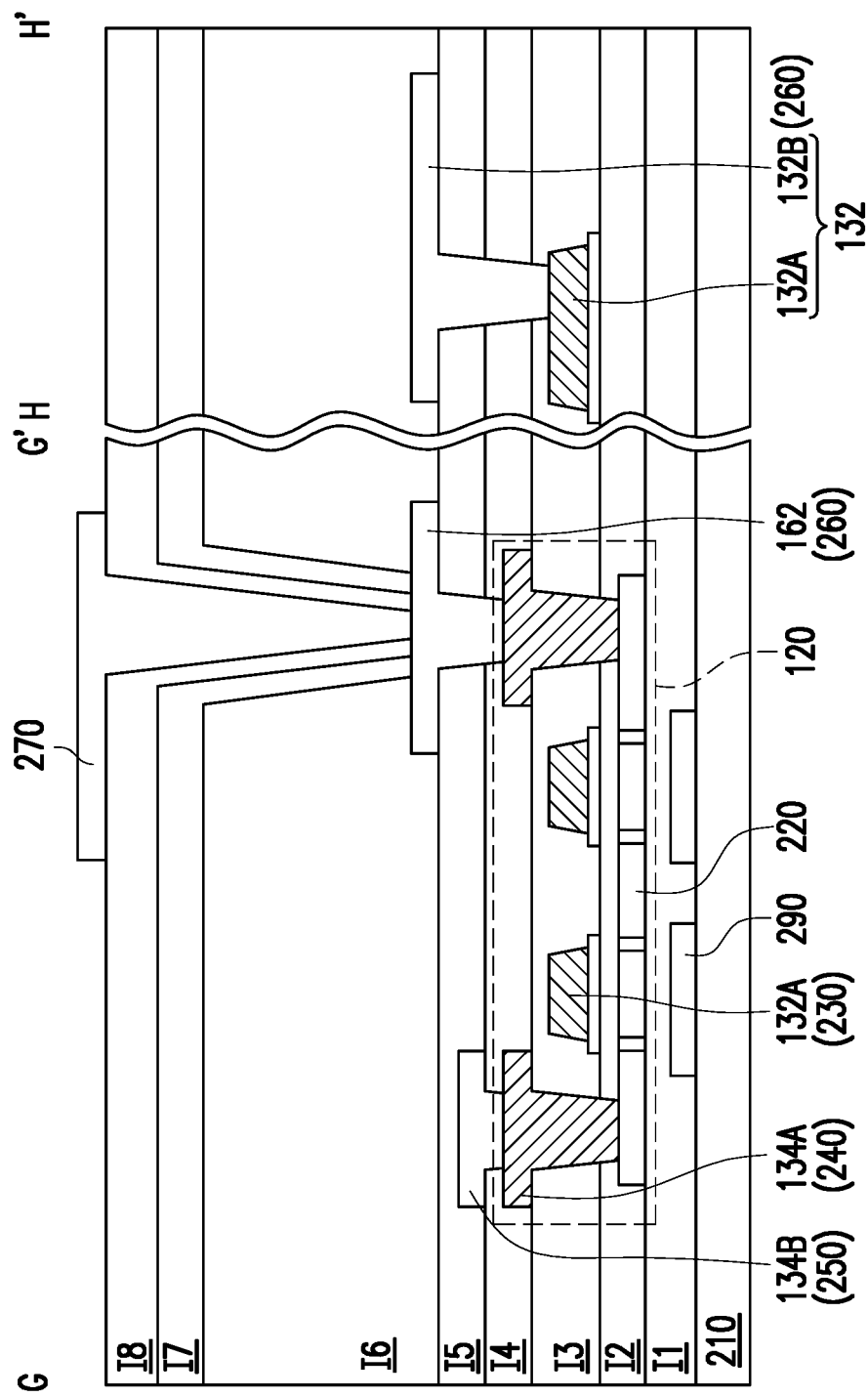
FIG. 10 is a schematic diagram of a cross-sectional structure of the array substrate of FIG. 8 taken along a line G-G' and a line H-H' in some embodiments.

FIG. 10 is a schematic diagram of a cross-sectional structure of the array substrate of FIG. 8 taken along a line G-G' and a line H-H' in some embodiments. The structure of FIG. 10 is substantially similar to that of FIG. 4B, so that the same reference numerals in the two embodiments denote the same components, and description thereof is not repeated herein. To be specific, the cross-sectional structure of FIG. 4B includes the substrate 210, the active layer 220, the first metal layer 230, the second metal layer 240, the first transparent conductive layer 250, the second transparent conductive layer 260, the third transparent conductive layer 270, the shielding layer 290 and the insulating layers I1-I8, and descriptions in FIG. 4B may be referred for configuration positions and corresponding structures of the above film layers. The active layer 220, the first metal layer 230, and the second metal layer 240 may constitute the driving element 120, and the descriptions of FIG. 4B may be referred for the specific structure and configuration of the driving element 120, which is not repeated herein. The main difference between the cross-sectional structure of FIG. 10 and the cross-sectional structure of FIG. 4B is that the first transparent conductive layer 250 located between the insulating layer I4 and the insulating layer I5 further includes the segment 134B of the signal line 134, and the second transparent conductive layer 260 located between the insulating layer I6 and the insulating layer I5 further includes the segment 132B of the signal line 132.

As shown in FIG. 8 and FIG. 10, according to some embodiments, at least one of the signal lines 132, 134, 136, 138 may comprise different materials. For example, at least one of the signal lines 132, 134, 136, 138 may include segments composed of a transparent conductive material. In detail, at least one of the signal lines 132, 134, 136, 138 may include different segments, one segment may be made of a metal material, and the other segment may be made of a transparent conductive material. In detail, the segment 132A of the signal line 132 may be a metal material, and is formed by patterning the first metal layer 230, and the segment 132B may be a transparent material, and is formed by patterning the second transparent conductive layer 260. The segment 134A of the signal line 134 may be a metal material and may be formed by patterning the second metal layer 240, and the segment 134B may be a transparent material and may be formed by patterning the first transparent conductive layer 250. Similarly, the segment 136B of the signal line 136 and the segment 138B of the signal line 138 may be transparent materials.

In this way, the transparent segment of the signal line does not need to be shielded by the light-shielding layer 170 in the counter substrate 100S2. As shown in FIG. 9, in the counter substrate 100S2, a region RS1 corresponding to the transparent segment 132B of the signal line 132 does not need to design the light-shielding layer 170, but may constitute a part of the transparent portion RT. Similarly, in the counter substrate 100S2, a region RS2 corresponding to the transparent segment 134B of the signal line 134, the transparent segment 136B of the signal line 136, and the transparent segment 138B of the signal line 138 does not need to design the light-shielding layer 170, but may constitute a part of the transparent portion RT. In this way, the area of the transparent portion RT may be made larger, so as to achieve a better light-transmitting effect.

Figure 11:
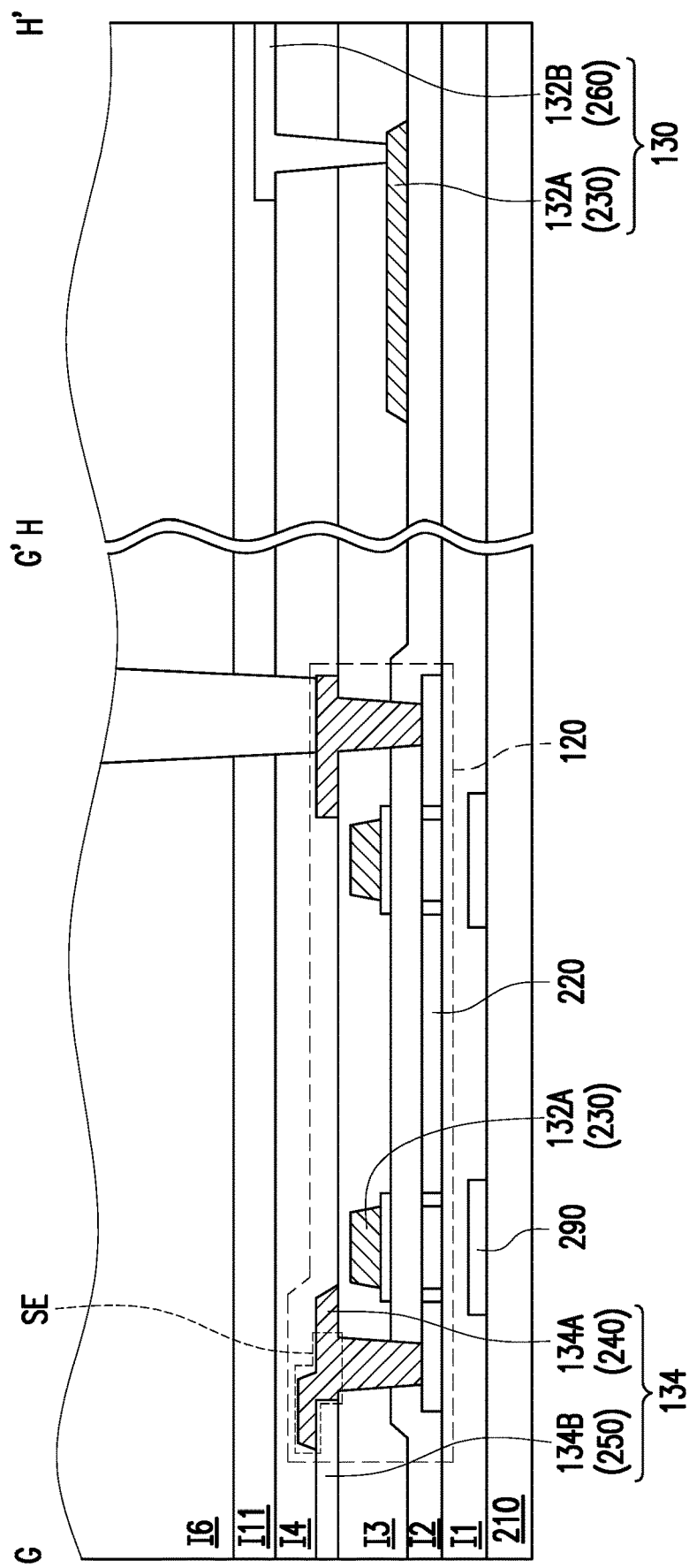
FIG. 11 is a schematic diagram of partial film layers of the cross-sectional structure of the array substrate of FIG. 8 taken along the line G-G' and the line H-H' in some embodiments.

FIG. 11 is a schematic diagram of partial film layers of the cross-sectional structure of the array substrate of FIG. 8 taken along the line G-G' and the line H-H' in some embodiments. The structure of FIG. 11 is substantially similar to that of FIG. 10, so that the same reference numerals in the two embodiments denote the same components, and description thereof is not repeated herein. To be specific, FIG. 11 only shows the film layers between the insulating layer I6 and the substrate 210, and the description of FIG. 10 may be referred for the structure and configuration of the other film layers, which is not repeated herein.

The main difference between FIG. 11 and FIG. 10 lies in the position of the first transparent conductive layer 250. In this embodiment, the first transparent conductive layer 250 is disposed on the insulating layer I3 and is patterned to define the segment 134B of the signal line 134. Meanwhile, the second metal layer 240 is disposed on the first transparent conductive layer 250 and is patterned to define the segment 134A of the signal line 134, so that the segment 134B formed by the first transparent conductive layer 250 is disposed between the segment 134A formed by the second metal layer 240 and the insulating layer I3. A part of the segment 134A of the signal line 134 may contact the active layer 220 to act as the source electrode SE of the driving element 120. In this way, the source electrode SE is electrically connected to the signal line 134, and the source electrode SE covers a part of the signal line 134.

In view of the foregoing, in the electronic device of the embodiments of the disclosure, the first sub-pixels of the plurality of pixels may be connected by conductive connection elements, and a single driving element may be used to drive each of the first sub-pixels of the plurality of pixels. The numbers of the driving elements and the signal lines are thereby reduced, and the light transmittance of the electronic device is accordingly improved. According to some embodiments, the electronic device may include the display panel and the light-sensing element, and light may reach the light-sensing element through the transparent region in the display panel. According to some embodiments, the conductive connecting component may include a transparent conductive material, which may increase the area of the transparent portion to improve the light transmittance of the electronic device. According to some embodiments, the signal line electrically connected to the driving element may include a transparent conductive material, which may also increase the area of the transparent portion to achieve an improved light-transmitting effect.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, comprising:
    a first unit comprising a first sub-unit, a second sub-unit, and a third sub-unit, wherein the first sub-unit of the first unit comprises a first electrode;
    a second unit comprising a first sub-unit, a second sub-unit, and a third sub-unit, wherein the first sub-unit of the second unit comprises a second electrode;
    a conductive line, wherein the first electrode of the first unit is electrically connected to the second electrode of the second unit through the conductive line; and
    a first insulating layer disposed between the first electrode of the first unit and the conductive line, wherein the first insulating layer comprises a first hole, and the first electrode of the first unit is electrically connected to the conductive line through the first hole.

2. The electronic device according to claim 1, further comprising a first signal line extending along a first direction, wherein in the first unit, the first sub-unit, the second sub-unit, and the third sub-unit are disposed along the first direction.

3. The electronic device according to claim 2, wherein in the second unit, the first sub-unit, the second sub-unit, and the third sub-unit are disposed along the first direction.

4. The electronic device according to claim 2, wherein the first signal line is a scan line.

5. The electronic device according to claim 2, further comprising a second signal line extending along a second direction intersecting the first direction, wherein the first unit and the second unit are adjacently disposed along the second direction.

6. The electronic device according to claim 5, wherein at least a portion of the conductive line extends along the second direction.

7. The electronic device according to claim 5, wherein the second signal line is a data line.

8. The electronic device according to claim 1, wherein in the first unit, the first sub-unit, the second sub-unit, and the third sub-unit display different colors.

9. The electronic device according to claim 8, wherein the first sub-unit of the first unit and the first sub-unit of the second unit display a same color.

10. The electronic device according to claim 1, wherein in the first unit, the first sub-unit comprises a first color filter part, the second sub-unit comprises a second color filter part, the third sub-unit comprises a third color filter part.

11. The electronic device according to claim 10, wherein the first color filter part, the second color filter part, and the third color filter part are of different colors.

12. The electronic device according to claim 1, wherein the electronic device comprises a transparent region and another region, and the first unit and the second unit are disposed in the transparent region.

13. The electronic device according to claim 12, further comprising a light-sensing element disposed in a position corresponding to the transparent region.

14. The electronic device according to claim 12, wherein the electronic device comprises another unit disposed in the another region, and the another unit comprises a first sub-unit, a second sub-unit, and a third sub-unit.

15. The electronic device according to claim 14, wherein an area of the first unit disposed in the transparent region and an area of the another unit disposed in the another region are different.

16. The electronic device according to claim 12, wherein a transmittance of the transparent region is higher than a transmittance of the another region.

17. The electronic device according to claim 1, wherein the electronic device comprises a self-luminous display panel.

* * * * *